United States Patent
Edwards et al.

(10) Patent No.: US 10,261,222 B2
(45) Date of Patent: Apr. 16, 2019

(54) RETROREFLECTIVE ARTICLES WITH WASH DURABLE BEAD BOND LAYERS

(71) Applicant: 3M INNOVATIVE PROPERTIES COMPANY, St. Paul, MN (US)

(72) Inventors: Bruce H. Edwards, White Bear Lake, MN (US); Shri Niwas, Maple Grove, MN (US); Ying Xia, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 210 days.

(21) Appl. No.: 15/319,007

(22) PCT Filed: Jun. 10, 2015

(86) PCT No.: PCT/US2015/035067
§ 371 (c)(1),
(2) Date: Dec. 15, 2016

(87) PCT Pub. No.: WO2015/195433
PCT Pub. Date: Dec. 23, 2015

(65) Prior Publication Data
US 2017/0146704 A1    May 25, 2017

Related U.S. Application Data (60) Provisional application No. 62/012,563, filed on Jun. 16, 2014.

(51) Int. Cl.
*G02B 5/12*    (2006.01)
*G02B 5/128*    (2006.01)
(Continued)

(52) U.S. Cl.
CPC ............. *G02B 5/128* (2013.01); *B05D 5/06* (2013.01); *B05D 7/582* (2013.01); *C08G 18/222* (2013.01);
(Continued)

(58) Field of Classification Search
CPC ............. C08G 18/246; C08G 18/3206; C08G 18/3215; C08G 18/3221; C08G 18/44;
(Continued)

(56) References Cited

U.S. PATENT DOCUMENTS

| | | |
|---|---|---|
| 1,175,224 A | 3/1916 | Bleecker |
| 2,461,011 A | 2/1949 | Taylor |

(Continued)

FOREIGN PATENT DOCUMENTS

| | | |
|---|---|---|
| CN | 101284980 | 10/2008 |
| JP | H08-158268 | 6/1996 |

(Continued)

OTHER PUBLICATIONS

Chopra, Thin Film Phenomena, 750 (1969).
International Search Report for PCT International Application No. PCT/US2015/035067, dated Dec. 21, 2015, 5pgs.

*Primary Examiner* — Euncha P Cherry
(74) *Attorney, Agent, or Firm* — Jeffrey M. Olofson (57) ABSTRACT

Retroreflective articles include a layer of optical elements, and a polyurethane bead bond layer. The optical elements include transparent microspheres, and at least one reflective layer. The polyurethane bead bond layer is the reaction product of a reaction mixture of at least one aliphatic polycarbonate polyol and at least one polyisocyanate, and the reaction mixture is free of polyols containing unsaturated groups. The retroreflective articles have improved wash durability.

21 Claims, 2 Drawing Sheets

(51) Int. Cl.

| | | |
|---|---|---|
| *C08G 18/44* | (2006.01) | |
| *C08G 18/66* | (2006.01) | |
| *C08G 18/76* | (2006.01) | |
| *C08G 18/22* | (2006.01) | |
| *C08G 18/24* | (2006.01) | |
| *C09D 175/06* | (2006.01) | |
| *C08G 18/32* | (2006.01) | |
| *B05D 5/06* | (2006.01) | |
| *B05D 7/00* | (2006.01) | |
| *C08K 5/5465* | (2006.01) | |
| *C23C 14/20* | (2006.01) | |
| *C23C 16/06* | (2006.01) | |
| *C23C 18/42* | (2006.01) | |
| *G02B 1/04* | (2006.01) | |
| *G02B 7/00* | (2006.01) | |

(52) U.S. Cl.
CPC ....... *C08G 18/246* (2013.01); *C08G 18/3206* (2013.01); *C08G 18/3215* (2013.01); *C08G 18/3221* (2013.01); *C08G 18/44* (2013.01); *C08G 18/6644* (2013.01); *C08G 18/7671* (2013.01); *C08K 5/5465* (2013.01); *C09D 175/06* (2013.01); *C23C 14/20* (2013.01); *C23C 16/06* (2013.01); *C23C 18/42* (2013.01); *G02B 1/04* (2013.01); *G02B 7/002* (2013.01)

(58) Field of Classification Search
CPC ............ C08G 18/6644; C08G 18/7671; C08K 5/5465; C09D 175/06; C23C 14/20; C23C 16/06; C23C 18/42; G02B 1/04; G02B 7/002
USPC .......................................................... 359/518
See application file for complete search history.

(56) References Cited

U.S. PATENT DOCUMENTS

| | | |
|---|---|---|
| 2,726,161 A | 12/1955 | Beck |
| 2,842,446 A | 7/1958 | Beck |
| 2,853,393 A | 9/1958 | Beck |
| 2,870,030 A | 1/1959 | Stradley |
| 2,939,797 A | 6/1960 | Rindone |
| 2,965,921 A | 12/1960 | Bland |
| 2,992,122 A | 7/1961 | Beck |
| 3,468,681 A | 9/1969 | Jaupain |
| 3,700,305 A | 10/1972 | Bingham |
| 3,946,130 A | 3/1976 | Tung |
| 4,192,576 A | 3/1980 | Tung |
| 4,367,919 A | 1/1983 | Tung |
| 4,564,556 A | 1/1986 | Lange |
| 4,758,469 A | 7/1988 | Lange |
| 4,763,985 A | 8/1988 | Bingham |
| 4,772,511 A | 9/1988 | Wood |
| 4,931,414 A | 6/1990 | Wood |
| 5,254,390 A | 10/1993 | Lu |
| 5,474,827 A | 12/1995 | Crandall |
| 5,620,775 A | 4/1997 | LaPerre |
| 5,812,317 A | 9/1998 | Billingsley |
| 5,976,669 A * | 11/1999 | Fleming ................ G02B 5/128 264/1.9 |
| 8,003,197 B2 | 8/2011 | Yukawa |
| 8,256,025 B2 | 9/2012 | Feduzi |
| 2007/0236795 A1 | 10/2007 | Moreau |
| 2008/0020210 A1 | 1/2008 | Griffin |
| 2011/0292508 A1 | 12/2011 | Huang |
| 2013/0108784 A1 | 5/2013 | Koppes |
| 2013/0274401 A1* | 10/2013 | Allen .................... C09J 175/04 524/445 |

FOREIGN PATENT DOCUMENTS

| | | |
|---|---|---|
| JP | 2004-133237 | 4/2004 |
| JP | 2005-082671 | 3/2005 |
| JP | 2008-023752 | 2/2008 |
| WO | WO 1996-35970 | 11/1996 |
| WO | WO 1997-01675 | 1/1997 |
| WO | WO 1999-32908 | 7/1999 |
| WO | WO 2000-020481 | 4/2000 |
| WO | WO 2000-079315 | 12/2000 |
| WO | WO 2009-011989 | 1/2009 |
| ZA | 2009005947 | 1/2012 |

* cited by examiner

RETROREFLECTIVE ARTICLES WITH WASH DURABLE BEAD BOND LAYERS

FIELD OF THE DISCLOSURE

This disclosure relates to retroreflective articles and methods of making and using them, especially retroreflective articles with wash durability.

BACKGROUND

A wide variety of articles that incorporate the phenomenon of retroreflectivity have been developed for a wide array of uses. Retroreflective articles have the ability to return a substantial portion of incident light back towards the light source. This unique ability has promoted widespread use of retroreflective safety articles. Besides traffic and warning signs and the like, a wide variety of clothing and similar articles such as backpacks, and the like have incorporated retroreflective articles into them. Persons who work or exercise near motor vehicle traffic need to be conspicuously visible so that they do not get struck by passing motor vehicles. When retroreflective articles are worn, the retroreflectivity highlights a person's presence by retroreflecting light from motor vehicle headlamps.

Retroreflective articles typically have an optical lens element layer, a polymeric bead bond layer, a reflective layer, and may also have a substrate layer. The optical lens elements commonly are microspheres that are partially embedded in the polymeric bead bond layer. The reflective layer typically is aluminum, silver, or a dielectric mirror that usually is disposed on the embedded portions of the microspheres. Light striking the front surface of the retroreflective article passes through the microspheres and is reflected by the reflective layer to re-enter the microspheres where the light's direction is then altered to travel back towards the light source. Thus, for example, when a vehicle's headlamps strike a retroreflective article, some of the light from the headlamps is reflected back to the driver of the vehicle.

It is generally not necessary, or even desirable, that an entire worn article be retroreflective, so retroreflective appliqués are often used. These retroreflective appliqués can then be attached to an article of clothing or other article to prepare a retroreflective article. In some instances, retroreflective appliqués have been made by partially embedding a microsphere layer in a thermoplastic carrier web, applying a reflective material over the microspheres' protruding portions, and then forming a bead bond layer over the coated microspheres. Often a pressure sensitive adhesive is applied on the bead bond layer's back surface, and a release liner is placed over the adhesive until the appliqué is secured to a substrate. The completed appliqué (also sometimes referred to as a transfer sheet) is supplied to a garment assembler in this form, and the garment assembler secures the appliqué to an article of clothing by removing the release liner and adhering the appliqué to an outer surface of the article of clothing. The carrier is then separated from the appliqué to expose the microspheres so that the appliqué can retroreflect light.

A number of retroreflective articles have been prepared and described. Among the retroreflective articles that have been prepared are those with bead bond layers that include a polyurethane material. In Japanese Patent Publication No. JP 8-158268, a method of manufacturing a light reflective coating cloth is described in which a resin layer is formed on a fiber cloth in which the resin layer has as its main body a polyurethane resin containing a metal fine powder such as aluminum, and forming a single or mixed resin layer of polyacrylate resin or polyurethane resin containing spherical transparent glass beads on said resin layer with a dry coating method. U.S. Pat. No. 5,976,669 (Fleming) describes a retroreflective article with retroreflective elements embedded in a binder layer that contains a solid polyurethane. The polyurethane includes soft segments, hard segments, silicone moieties, and urethane moieties. PCT Publication WO 2009/011989 teaches a method for preparing vulcanizable retroreflective sheeting in which the method comprises providing a reaction mixture comprising at least one diisocyanate, at least one polyisocyanate, at least one polyol, at least one unsaturated polyol, and at least one chain extension agent, coating the reaction mixture on a carrier web that comprises retroreflective elements, curing the reaction mixture, and removing the carrier.

SUMMARY

Disclosed herein are retroreflective articles and methods of making and using them. In some embodiments, the retroreflective articles comprise a polyurethane bead bond layer, and a layer of optical elements partially embedded in the bead bond layer. The optical elements comprise transparent microspheres, and at least one reflective layer. The polyurethane bead bond layer comprises the reaction product of a reaction mixture comprising at least one aliphatic polycarbonate polyol and at least one polyisocyanate, and the reaction mixture is free of polyols containing unsaturated groups. The reaction mixture may contain additional additives such as additional polyols, silane coupling agents, and curing catalysts. The retroreflective articles are wash durable.

Also disclosed are articles of clothing. In some embodiments, the articles of clothing comprise a fabric with a first major surface and a second major surface, and a retroreflective appliqué attached to the first major surface of the fabric. The retroreflective appliqué comprises a polyurethane bead bond layer, a layer of optical elements partially embedded in the bead bond layer, and a support layer attached to the polyurethane bead bond layer. The optical elements comprise transparent microspheres, and at least one reflective layer. The polyurethane bead bond layer comprises the reaction product of at least one aliphatic polycarbonate polyol and at least one polyisocyanate, and the reaction mixture is free of polyols containing unsaturated groups. The support layer comprises a layer of adhesive, a film layer, a fabric layer, or a non-woven layer, and the support layer is attached to the first major surface of the fabric.

Methods of preparing articles are also described. In some embodiments, the method of preparing an article comprises providing a polymeric carrier layer with a first major surface and a second major surface, providing transparent microspheres, partially embedding the transparent microspheres into the first major surface of the polymeric carrier layer such that the beads at least partially protrude from the first major surface of the polymeric carrier layer to form a layer of microspheres, depositing one or more reflective layers on at least a portion of the first major surface of the polymeric carrier layer and the layer of microspheres, providing a reaction mixture comprising at least one aliphatic polycarbonate polyol and at least one polyisocyanate, where the reaction mixture is free of polyols containing unsaturated groups, applying the reaction mixture to the layer of microspheres, and curing the reaction mixture to form a polyurethane bead bond layer. The methods may further comprise attaching a support layer to the polyurethane bead bond layer. Removing the polymeric carrier layer generates a wash durable retroreflective article.

BRIEF DESCRIPTION OF THE DRAWINGS

The present application may be more completely understood in consideration of the following detailed description of various embodiments of the disclosure in connection with the accompanying drawings.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The desirability of making a wide variety of articles retroreflective has led to the increasing use of retroreflective articles. In some applications, an entire article may be made retroreflective; in others, a portion of the article may be made retroreflective through the use of one or more retroreflective appliqués. The retroreflective articles typically have an optical element layer, a polymeric bead bond layer, and a reflective layer. The optical elements commonly are microspheres that are partially embedded in the polymeric bead bond layer. The reflective layer typically is aluminum, silver, or a dielectric mirror that usually is disposed on the embedded portions of the microspheres. Light striking the front surface of the retroreflective article passes through the microspheres and is reflected by the reflective layer to re-enter the microspheres where the light's direction is then altered to travel back towards the light source. Thus, for example, when a vehicle's headlamps strike a retroreflective article, some of the light from the headlamps is reflected back to the driver of the vehicle. This permits the driver of the vehicle to be aware of the person wearing the retroreflective article long before the driver would see the person if he or she were not wearing the retroreflective article. These retroreflective articles and appliqués can be attached to a wide range of articles, including everything from bicycles and motorized vehicles to a wide range of clothing such as jackets, vests, shirts, shoes, hats, and the like.

In this disclosure, articles are described that have a polyurethane bead bond layer that enhances the durability of the retroreflective article, especially the wash durability of the retroreflective article. The polyurethane bead layer is prepared from a reaction mixture that contains polycarbonate polyols. Since it is desirable that the articles that are made retroreflective be washable, wash durability is particularly important. By wash durability it is meant the number of times that the article can be laundered without losing its retroreflective performance.

Wash durability is a particularly desirable feature for retroreflective articles to possess. Therefore considerable effort has been made to provide this feature. Among the techniques that have been utilized include placing a protective layer over the bead layer (on the surface of the bead layer that is opposite to the surface of the beads that contains the reflective layer), placing a protective layer between the beads and the reflective layer, and changing the bead bond layer to make it more wash durable. Each of these approaches has advantages and disadvantages. Placing protective layers either over the bead layer or between the beads and the reflective layer means that this protective layer is in the optical pathway that light rays follow when entering and leaving the article after being retroreflected. While considerable progress has been made to minimize negative effects upon the retroreflective properties of the articles containing these protective layers, the presence of these layers in the optical pathway can negatively impact the performance of these articles. Additionally, the coating of these protective layers onto the articles requires additional processing steps and thus added expense, time, and labor to prepare these articles.

Considerable effort has also been expended in modifying the bead bond layer to make it more wash durable, and thus to improve the wash durability of the retroreflective articles. Some of these attempts have included the use of polyurethane materials in the bead bond layer. For example, U.S. Pat. No. 5,976,669 (Fleming) describes a retroreflective article with retroreflective elements embedded in a binder layer that contains a solid polyurethane. The polyurethane includes soft segments, hard segments, silicone moieties, and urethane moieties. The solid polyurethane material used is based upon an isocyanate-terminated polyurethane prepolymer prepared from a polyol to provide soft segments that is a polyester-polyalkoxy-polyester ABA block copolymer and a carobcyclic polyisocyanate which provides the hard segments.

In this disclosure, polyurethane bead bond layers are described which are prepared from polycarbonate polyols. The polyurethane bead bond layers of this disclosure have improved wash durability over polyurethane bead bond layers that are prepared from polyester polyols. In some embodiments of this disclosure, some polyester groups may be present in the polyol synthons, but polycarbonate linking groups are predominate.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are pressure sensitive adhesives, heat activated adhesives and laminating adhesives.

Pressure sensitive adhesive compositions are well known to those of ordinary skill in the art to possess properties including the following: (1) aggressive and permanent tack at room temperature, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

Heat activated adhesives are non-tacky at room temperature but become tacky and capable of bonding to a substrate at elevated temperatures. These adhesives usually have a Tg or melting point (Tm) above room temperature. When the temperature is elevated above the Tg or Tm, the storage modulus usually decreases and the adhesive become tacky.

Laminating adhesives (also sometimes referred to as contact adhesives) are adhesives designed to form bonds to two substrates immediately after dispensing. Once the adhesive has been dispensed, there is a limited time, sometimes referred to as "open time" in which the adhesive can form a bond to two substrates. Once the open time has elapsed, the laminating adhesive is no longer capable of forming adhesive bonds. Examples of laminating adhesives are hot melt adhesives, solutions or dispersions of polymeric materials or materials curable to form polymeric materials in a liquid medium, and curable adhesives. The laminating adhesive is coated onto a substrate, a second substrate is contacted to the adhesive surface and the formed three layer construction is cooled, dried, and/or cured to form a laminate. Examples of laminating adhesives include the glue sticks used in hot glue guns (which are hot melt types of adhesives that form bonds upon cooling), casein glues, sometimes called "white glue", (which are water-borne dispersions that form bonds upon drying), and cyanoacrylate adhesives (which cure to form bonds upon exposure to air).

Unless otherwise indicated, the terms "transparent' and "optically transparent" are used interchangeably and refer to an article, film or adhesive that has a high light transmittance over at least a portion of the visible light spectrum (about 400 to about 700 nm). By high light transmittance over at least a portion of the visible light spectrum it is meant at least 50% transmittance, in some embodiments at least 70% transmittance, or even greater than 90% transmittance.

As used herein, the term "polymer" refers to a polymeric material that is a homopolymer or a copolymer. As used herein, the term "homopolymer" refers to a polymeric material that is the reaction product of one monomer. As used herein, the term "copolymer" refers to a polymeric material that is the reaction product of at least two different monomers.

The term "polyurethane" is used to describe polymers that contain a chain of organic groups linked by urethane (sometimes also called carbamate) linkages. The urethane linkages have the structure —NH—(CO)—O— where (CO) refers to a carbonyl group C═O. Polyurethanes are prepared from the reaction of a polyisocyanate and a polyol. The term "polyisocyanate" refers to an organic material containing at least two isocyanate groups. Isocyanate groups have the structure —N═C═O, and polyisocyanates have the general structure $R_a(N{=}C{=}O)_n$ where n is a number equal to 2 or greater, and $R_a$ is an n-valent organic group which may be aliphatic, aromatic or a combination thereof, and may be polymeric. When n is 2, the material is a di-isocyanate, when n is 3, the material is a tri-isocyanate, when n is 4, the material is a tetra-isocyanate, etc. The term "polyol" refers to an organic material containing at least two hydroxyl groups. Hydroxyl groups have the structure —OH, and polyols have the general structure $R_b(OH)_n$, where n is a number equal to 2 or greater, and $R_b$ is an n-valent organic group which may be aliphatic, aromatic or a combination thereof and typically is a polymeric unit containing functional group linkages. When n is 2, the material is a diol, when n is 3, the material is a triol, when n is 4, the material is a tetraol, etc. The functional group linkages are frequently used to describe the polyol. For example, "polyether polyol" refers to a polyol where the $R_b$ group contains ether linkages, "polyester polyol" refers to a polyol where the $R_b$ group contains ester linkages, "polycarbonate polyol" refers to a polyol where the $R_b$ group contains carbonate linkages. Ether linkages have the general structure —O—. Ester linkages have the general structure —O—(CO)—, where (CO) refers to a carbonyl group C═O. Carbonate linkages have the general structure —O—(CO)—O—, where (CO) refers to a carbonyl group C═O. Aliphatic polyols are ones that contain only hydrocarbon groups that are aliphatic, that is to say that it does not contain aromatic hydrocarbon groups. Unsaturated polyols are ones that contain one or more unsaturated groups, that is to say that it contains a terminal group with the general structure, —RC═CH$_2$, where R is H or an alkyl group.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, 3-methylpentyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms. The alkylene group may also be substituted with one or more alkyl or aryl groups.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene. The arylene group may also be substituted with one or more alkyl or aryl groups.

The term "alkoxy" refers to a monovalent group of the formula —OR, where R is an alkyl group.

The term "acrylic" refers to compounds of the general structure $H_2C=CR^1-C(O)-OR^2$ where (CO) refers to a carbonyl group C=O, $R^1$ is hydrogen or —$CH_3$ and $R^2$ is hydrogen, alkyl or hydroxyalkyl.

As used herein the terms "thermoplastic", "non-thermoplastic", and "thermoset", refer to properties of materials. Thermoplastic materials are materials which melt and/or flow upon the application of heat, resolidify upon cooling and again melt and/or flow upon the application of heat. The thermoplastic material undergoes only a physical change upon heating and cooling, no appreciable chemical change occurs. Non-thermoplastic materials are materials that do not flow upon the application of heat up to a temperature where the material begins to degrade. Thermoset materials are curable materials that irreversibly cure, such as becoming crosslinked, when heated or cured. Once cured, the thermoset material will not appreciably melt or flow upon application of heat.

Disclosed herein are methods of preparing retroreflective articles. These methods comprise providing a polymeric carrier layer with a first major surface and a second major surface, providing transparent microspheres, partially embedding the transparent microspheres into the first major surface of the polymeric carrier layer such that the beads at least partially protrude from the first major surface of the polymeric carrier layer to form a layer of microspheres, depositing one or more reflective layers on at least a portion of the first major surface of the polymeric carrier layer and the layer of microspheres, and providing a reaction mixture comprising at least one aliphatic polycarbonate polyol and at least one polyisocyanate, applying the reaction mixture to the layer of microspheres, and curing the reaction mixture to form a polyurethane bead bond layer. The reaction mixture may comprise more than one polyol, but is free of polyols containing unsaturated groups. The thus formed article is an intermediate article and can be transformed into a retroreflective article by removing the polymeric carrier layer.

In some embodiments, depositing one or more reflective layers on at least a portion of the first major surface of the polymeric carrier layer and the layer of microspheres comprises depositing a layer of reflective metal to a selected portion of the layer of microspheres. This selective deposition can be achieved in a variety of ways, for example, portions of the surface can be masked to prevent the deposition of the metal. In other embodiments, depositing one or more reflective layers on at least a portion of the first major surface of the polymeric carrier layer comprises depositing one or more layers of dielectric material on a selected portion of the layer of microspheres. Generally, multiple layers of dielectric material are deposited to form the dielectric reflecting layer, which is sometimes called a dielectric mirror. A combination of these types of deposition can also be used.

A wide variety of materials are suitable for use in the methods described above. Examples of these materials are described below.

A wide variety of materials and combinations of materials are suitable for the polymeric carrier layer. In many embodiments the polymeric carrier layer is a thermoplastic polymeric carrier layer, but in other embodiments the polymeric carrier layer may comprise an elastomeric polymeric carrier layer, and in some embodiments may even be a pressure sensitive adhesive or a heat activated adhesive. Typically the polymeric carrier layer comprises a thermoplastic polymeric carrier layer. In some embodiments, the thermoplastic polymeric carrier layer may be a standalone layer; in other embodiments the thermoplastic polymeric carrier layer may comprise a coating of thermoplastic polymeric carrier material on the first major surface of a sheet. The sheet may comprise, for example, paper, a polymeric film, and the like. Examples of useful polymeric carrier materials include polyvinyl chloride, polysulfones, polyalkylenes such as polyethylene, polypropylene and polybutylene, polyesters, and the like.

A layer of partially embedded transparent microspheres is formed on the surface of the polymeric carrier layer. The monolayer of transparent microspheres is assembled by cascading transparent microspheres onto the polymeric carrier layer, which secures the microspheres in a desired temporary assignment. Typically, the polymeric carrier layer is heat softened. The microspheres are generally packed as closely as possible, ideally in their closest hexagonal arrangement, to achieve very good retroreflective brightness and may be so arranged by any convenient application process, such as printing, screening, cascading, or hot rolling. Upon cooling, the polymeric carrier layer retains the microspheres in a desired arrangement.

Typically, the transparent microspheres are substantially spherical in shape in order to provide the most uniform and efficient retroreflection. The microspheres are substantially transparent so as to minimize absorption of light so that a large percentage of the incident light is retroreflected. The microspheres often are substantially colorless but may be tinted or colored in some other fashion.

The microspheres may be made from glass, a non-vitreous ceramic composition, or a synthetic resin. Glass and ceramic microspheres are particularly suitable because they tend to be harder and more durable than microspheres made from synthetic resins. Examples of microspheres that may be used are described in the following U.S. Pat. Nos. 1,175,224, 2,461,011, 2,726,161, 2,842,446, 2,853,393, 2,870,030, 2,939,797, 2,965,921, 2,992,122, 3,468,681, 3,946,130, 4,192,576, 4,367,919, 4,564,556, 4,758,469, 4,772,511, and 4,931,414.

The microspheres typically have an average diameter in the range of about 30 to 200 micrometers. Microspheres smaller than this range tend to provide lower levels of retroreflection, and microspheres larger than this range may impart an undesirably rough texture to the appliqué or may undesirably reduce its flexibility. The microspheres typically have a refractive index of about 1.7 to about 2.0, the range typically considered to be useful in exposed lens retroreflective products.

As described above, a reflective layer is applied to at least a portion of the microsphere layer. The reflective layer may be a reflective metal layer, a dielectric reflective layer, or a combination thereof.

The reflective metal layer is a specularly reflective metal that forms a reflective metal layer coating. This technique facilitates the arrangement of the retroreflective elements (optical elements and reflective material) in substantially uniform direction for retroreflection. The size of the retroreflective elements, i.e. the surface portion of the microspheres covered with the reflective material, may be controlled in part by controlling the depth to which the microspheres are embedded in the polymer prior to applying the reflective material.

The reflective material can be a layer comprising an elemental metal that is capable of specularly reflecting light. A variety of metals may be used to provide a specular reflective metal layer. These include aluminum, silver, chromium, gold, nickel, magnesium, and the like, in elemental form, and combinations thereof. Aluminum and silver are particularly suitable metals for use in a reflective layer from a performance standpoint. The metal may be a continuous coating such as is produced by vacuum-deposition, vapor coating, chemical-deposition, or electroless plating. It is to be understood that in the case of aluminum, some of the metal may be in the form of the metal oxide and/or hydroxide. Aluminum and silver metals are desirable because they tend to provide the highest retroreflective brightness. The metal layer should be thick enough to reflect incoming light. Typically, the reflective metal layer is about 50 to 150 nanometers thick.

The dielectric reflective layer is a dielectric mirror. The dielectric mirror may be similar to known dielectric mirrors disclosed in U.S. Pat. Nos. 3,700,305 and 4,763,985 to Bingham. The dielectric mirrors typically are multi-layer constructions, with a layer having a refractive index $n_2$ and a layer of transparent material disposed thereon which has a refractive index $n_1$, and the opposite face of the transparent material (having a refractive index $n_1$) is in contact with a material having a refractive index $n_3$, where both $n_2$ and $n_3$ have a refractive index of at least 0.1, more typically at least 0.3, higher or lower than $n_1$. The transparent material is a layer that typically has an optical thickness corresponding to odd numbered multiples (that is, 1, 3, 5, 7 . . . ) of about one-quarter wavelength of light in the wavelength range of about 380 to about 1,000 nanometers. Thus, either $n_2 > n_1 < n_3$ or $n_2 < n_1 > n_3$, and the materials on either side of the transparent layer may be either both higher or both lower in refractive index than $n_1$. When $n_1$ is higher than both $n_2$ and $n_3$, $n_1$ is in the 1.7 to 4.9 range, and $n_2$ and $n_3$ are in the 1.2 to 1.7 range. Conversely, when $n_1$ is lower than both $n_2$ and $n_3$, $n_1$ is in the 1.2 to 1.7 range, and $n_2$ and $n_3$ are in the 1.7 to 4.9 range. The dielectric mirror generally comprises a contiguous array of materials, at least one being in layer form, having an alternating sequence of refractive indices. Typically, the contiguous array has from two to seven layers, more typically three to five layers, adjacent to the lens element. A dielectric mirror can provide very good retroreflectivity, although, it typically is not as efficient a reflector as a reflective metal layer.

Among the many compounds that may be used in providing transparent materials within the desired refractive index range are: high index materials such as CdS, $CeO_2$, CsI, GaAs, Ge, InAs, InP, InSb, $ZrO_2$, $Bi_2O_3$, ZnSe, ZnS, $WO_3$, PbS, PbSe, PbTe, RbI, Si, $Ta_2O_5$, $ZrO_2$, Te, $TiO_2$; low index materials such as cryolite, $Al_2O_3$, $A_1F_3$, $CaF_2$, $CeF_3$, LiF, $MgF_2$, $Na_3AlF_6$, $ThOF_2$, elastomeric copolymers of perfluoropropylene and vinylidene fluoride (refractive index of >>1.38), etc. Other materials are reported in Thin Film Phenomena, K. L. Chopra, page 750, McGraw-Hill Book Company, N.Y., (1969). Particularly suitable dielectric mirrors contain layers of $SiO_2$, $CaF_2$, $MgF_2$, ZnS, $Nb_2O_5$, $Ta_2O_5$, $ZrO_2$, or combinations thereof. In some embodiments, the dielectric reflective layer comprises a layer of $CaF_2$, ZnS, or a combination thereof.

The method of this disclosure also includes providing a reaction mixture comprising at least one aliphatic polycarbonate polyol and at least one polyisocyanate, applying the reaction mixture to the layer of micro spheres, and curing the reaction mixture to form a polyurethane bead bond layer. The aliphatic polycarbonate polyol does not contain unsaturated groups, and may be a diol or a higher functional polyol. The reaction mixture may additionally contain other components, such as additional polyols (as long as the additional polyols are not unsaturated polyols), silane coupling agents, and curing catalysts. It may be desirable that the reaction mixture contain a stoichiometric excess of polyisocyanate. By this it is meant that the number of reactive isocyanate groups present in the reactive mixture is larger than the number of reactive hydroxyl groups.

A wide variety of polyisocyanates are suitable for preparing the polyurethane bead bond layer. Examples of suitable polyisocyanates include any suitable organic polyisocyanate, aliphatic, cycloaliphatic, araliphatic or aromatic, can be used alone, or in combinations. While aromatic or aliphatic isocyanates are suitable, in some embodiments, aromatic polyisocyanates may be particularly suitable. Diisocyanates are one particularly desirable class of polyisocyanate. Low levels of isocyanates containing more than two isocyanate groups in the molecule can be included without measurable changes in the characteristics of the resulting polymer. Suitable organic polyisocyanates include dicyclohexylmethane 4,4'-diisocyanate (commonly referred to as $H_{12}MDI$), 1,3-bis(isocyanatomethyl)cyclohexane, 1,3-bis(1-isocyanato-1-methylethyl)benzene (commonly referred to as TMXDI), 3,5,5-trimethyl-1-isocyanato-3-isocyanatomethylcyclohexane (commonly referred to as isophorone diisocyanate or IPDI), m-phenylene diisocyanate, p-phenylene diisocyanate, 2,4-tolylene diisocyanate, 2,6-tolylene diisocyanate, 4,4'-diisocyanato diphenylmethane (commonly referred to as MDI), benzidine diisocyanate, naphthalene-1,5-diisocyanate, hexamethylene diisocyanate (commonly referred to as HDI) and other alkylene diisocyanates (e.g., tetramethylene diisocyanate, decamethylene diisocyanate, and dodecamethylene diisocyanate), 4,4',4"-triphenylmethane triisocyanate, polyphenylmethylene polyisocyanates that are produced by phosgenation of aniline/formaldehyde condensation products containing up to about four aromatic rings, dianisidine diisocyanate, xylene diisocyanate, bis(2-isocyanatoethyl)fumarate, bis(2-isocyanatoethyl) cyclohex-4-ene-1,2-dicarboxylate, bis(2-isocyanatoethyl) carbonate, and many other organic polyisocyanates known in the art.

A wide variety of polycarbonate polyols are suitable including the alkylene oxide adducts of polycarbonate polyols. The term "alkylene oxide" includes, e.g., ethylene oxide, 1,2-epoxypropane, 1,2-epoxybutane, 2,3-epoxybutane, isobutylene oxide, epichlorohydrin, and the like and mixtures thereof. The polyols may be diols, triols, or higher functional polyols, typically diols are generally suitable. Particularly suitable polycarbonate polyols are those diols described by Formula 1 below:

| HO—[(CH$_2$)$_2$CHR$^1$(CH$_2$)$_n$—O—(CO)—O—]$_m$— [(CH$_2$)$_2$CHR$^1$(CH$_2$)$_n$]—OH | Formula 1 | where (CO) defines a carbonyl group C=O, $R^1$ is hydrogen or methyl; n is an integer of 2 or 3, such that n is 3 when $R^1$ is hydrogen, and n is 2 when $R^1$ is methyl; and m is number greater than 3, typically m is a number in the range 3-23.

The molecular weight of the polyol component is one significant factor in determining the final properties of the polymer. Generally, the higher the molecular weight, the softer the resulting polymer. The term "molecular weight" is used herein to refer to the number average molecular weight (MO. Polyols of molecular weight as low as 500 grams/mole and as high as 10,000 grams/mole are suitable, or molecular weight ranges of 500 grams/mole to 6,000 grams/mole, with molecular weight ranges of 500 grams/mole to 3,000 grams/mole being particularly suitable and most readily commercially available.

Commercially available polycarbonate polyols include those available from Kuraray America, Inc. as KURARAY POLYOL C-590, KURARAY POLYOL C-2050, KURARAY POLYOL C-2090, and KURARAY POLYOL C-3090.

Besides the polycarbonate polyol, additional polyols may also be included, such as polyoxyalkylene polyols. These polyoxyalkylene polyols include alkylene oxide adducts of, e.g., water, ethylene glycol, diethylene glycol, propylene glycol, dipropylene glycol, glycerol, 1,2,6-hexanetriol, 1,1,1-trimethylol ethane or propane, pentaerythritol, and the like. The alkylene oxides used in producing polyoxyalkylene polyols normally have from 2 to 4 carbon atoms. Ethylene oxide, propylene oxide, and mixtures thereof are particularly suitable. Aromatic polyols may also be used such as, for example alkylene oxide adducts of Bis-phenol A. Acrylic polyols may also be used such as, for example copolymerized adducts of acrylic monomers, such as ethyl acrylates, butyl acrylates, acrylic acid, methyl methacrylate, or styrene with hydroxylated acrylic monomers such as 2-hydroxyethyl acrylates or 4-hydroxybutyl acrylates or the like, as long as the acrylic polyols are not unsaturated polyols. Natural product based polyols may also be used such as, for example those derived from castor oil and the like.

The reactive mixture may also comprise a silane coupling agent. Silane coupling agents are well known bi-functional silane compounds that have a silane group at one terminus and a reactive group at the other terminus. Examples of reactive functional groups include thiol groups, amino groups, hydroxyl groups, epoxy groups, and isocyanate groups. Particularly suitable silane coupling agents are ones with amino or isocyanate functional groups. In this way the silane coupling agent co-reacts with reactive mixture to become incorporated into the final polymer. Examples of commercially available silane coupling agents include the amino-functional silane DYNASYLAN 1122 available from Evonik Industries, Overland Park, Kans., and the isocyanate-functional silane SILQUEST A-LINK 25 available from Momentive Performance Materials, Strongsville, Ohio.

The reactive mixture may also contain a curing catalyst. The curing catalyst, if used can be any of the commonly curing catalysts used in the formation of polyurethane polymers. Typical polyurethane catalysts are amine compounds (in particular tertiary amines such as triethylenediamine (TEDA, 1,4-diazabicyclo[2.2.2]octane or DABCO), dimethylcyclohexylamine (DMCHA), and dimethylethanolamine (DMEA)) and metal complexes. Metal complexes of lead, tin, bismuth, and zinc are often used as catalysts for polyurethane polymerization. In particular, bismuth and zinc carboxylates, and alkyl tin carboxylates are typically used. In the present disclosure, tin catalysts such as FASCAT 4202 (dibutyltin dilaurate) commercially available from Arkema, Inc. King of Prussia, Pa. are generally suitable.

The reaction mixture may optionally contain a wide range of additional additives if desired. Among suitable additives are dyes, pigments, UV stabilizers, antioxidants, UV absorbers, property modifiers, performance enhancers, or combinations thereof. Such additives can provide features such as color and UV stability and can enhance the stability and flame retardency of the formed articles.

In some embodiments at least one dye or pigment is added to the reactive mixture such that the formed polyurethane bead bond layer is a colored bead bond layer. The colored bead bond layer typically contains a colorant, generally the colorant is a pigment, a dye, or combination thereof. Typically pigments are used as pigments are more colorfast than dyes, meaning that pigments tend to retain their color under a variety of conditions and for longer times than do dyes. Generally, if additives are present, the bead bond layer contains from about 70 weight percent up to about 99 weight percent of the polyurethane with the remainder being colorant or other optional additives in effective amounts.

As described above, the reaction mixture is applied to the layer of microspheres and cured to form the polyurethane bead bond layer. This curing can be effected by the application of heat, by permitting the reaction mixture to stand for a period of time at room temperature, or by a combination thereof. Typically, heat is applied to speed curing. Temperatures of from about 50° C. to about 120° C. can be used. Heating can be carried out through the use of an oven, for example.

The formed polyurethane bead bond layer typically has a thickness of about 50 to 250 micrometers (2 to 10 mils), with thicknesses of about 75 to 200 micrometers (3 to 8 mils) often being particularly suitable. It is to be understood that a bead bond layer having a thickness outside these ranges may be used; however, if the bead bond layer is too thin, it may not provide sufficient support to the microspheres, allowing them to become dislodged.

In some embodiments, the method may further include the application of a support layer to the polyurethane bead bond layer. The support layer can be contacted to the polyurethane bead bond layer prior to curing, that is to say, that the support layer can be contacted to the reaction mixture layer, such that when the reaction mixture cures the bead bond layer is adhered to the support layer. The support layer can be a single layer or multi-layer article. Examples of suitable support layers include a film layer, a fabric layer, or a non-woven layer.

In other embodiments, the support layer is contacted to the polyurethane bead bond layer after curing. Examples of suitable support layers include a layer of adhesive, a film layer, a fabric layer, or a non-woven layer. Examples of suitable adhesives include pressure sensitive adhesives, heat activated adhesives and laminating adhesives. The adhesive layer can be covered by a release liner if desired to protect the adhesive surface from contamination until used. The adhesive layer can be used alone as the support layer or the adhesive layer can be used to adhere the polyurethane bead bond layer to a wide range of substrates such as films, fabrics and non-wovens. In addition, a wide range of substrates such as films, fabrics and non-wovens can be adhered to the polyurethane bead bond layer by mechanical means such as by sewing or heat lamination. Particularly desirable substrates are fabrics so that the formed article is an article of clothing.

The thus formed articles are sometimes called "intermediate articles". By intermediate articles it is meant articles in which the polymeric carrier layer is attached to the article. The intermediate articles are not themselves retroreflective articles, but become retroreflective articles upon the removal of the polymeric carrier layer.

The intermediate article can be immediately subjected to additional steps to generate the final retroreflective article, or the intermediate article can be stored for later use, shipped to another location, or subjected to additional processing steps such as cutting, attachment to a substrate, and the like. It is often desirable to form this intermediate article, because this intermediate article can be stored, shipped, or processed without exposing the optical elements. Once the optical elements are exposed, even though they contain a polyurethane bead bond layer, they are subject to potential damage from abrasion, staining and the like. When desired, the polymeric carrier layer is removed to form the final retroreflective article.

The above methods can be used to prepare a wide variety of retroreflective articles. Disclosed herein are retroreflective articles that comprise a layer of optical elements. The optical elements are transparent microspheres, and at least one reflective layer. The optical elements are embedded in a polyurethane bead bond layer, where the polyurethane bead bond layer comprises the reaction product of a reaction mixture comprising at least one aliphatic polycarbonate polyol and at least one polyisocyanate, and where the reaction mixture is free of polyols containing unsaturated groups. The reactive mixtures suitable for forming the polyurethane bead bond layer are described in detail above. The reflective layer may be a reflective metal layer, a dielectric reflective layer, or a combination thereof. The retroreflective articles have wash durability.

By wash durability it is meant that the retroreflective articles of this disclosure are capable of being laundered without losing the desired properties of the article, namely retroreflectivity. Wash durability of retroreflective articles can be described in a variety of different ways. An example of good washing performance was described in US Patent Publication No. 2011/0292508 (Huang et al.), as retaining at least about 100 candelas/lux/meter$^2$ at 5/0.2 angle after being washed 15 times. In some embodiments, the retroreflective article can retain at least about 200 candelas/lux/meter$^2$ at 5/0.2 angle after being washed 15 times. In yet other embodiments, the retroreflective article can retain at least about 300 candelas/lux/meter$^2$ at 5/0.2 angle after being washed 15 times.

In some embodiments, it is desirable that the surface of the retroreflective articles be discontinuous. By discontinuous it is meant that there is a region on the surface that is devoid of microspheres and bead bond layer, with the discontinuities surrounded by regions of continuity. These discontinuities can be beneficial for a variety of reasons. In some embodiments, the discontinuities can form a pattern or design. The pattern or design can be in the form of indicia, logos, etc. In other embodiments, the discontinuities can be arranged either randomly or in a non-continuous pattern. Besides the visual effect of the discontinuities, the discontinuities can provide enhanced breathability for the retroreflective article. By this it is meant that gases, and or moisture can pass through the retroreflective article more easily. An effect of the enhanced breathability is to be more comfortable for a person wearing such an article. This is particularly desirable for construction workers, firefighters, emergency workers, and people exercising. Examples of various designs of retroreflective articles having discontinuous segments can be seen FIGS. 2-5 of U.S. Pat. No. 8,256,025.

Retroreflective articles with discontinuous surfaces can be prepared a variety of different ways. A particularly suitable way involves partially removing optical elements and bead bond layer from portions of the surface. This removal can be effected by cutting, scraping, hole-punching, and other suitable mechanical means.

The retroreflective articles may be stand alone articles, or the polyurethane layer may have a support layer attached to make the retroreflective article part of a larger article. The support layer may comprise a layer of adhesive, a film layer, a fabric layer, or a non-woven layer. Examples of suitable support layers are described above.

Figure 1:
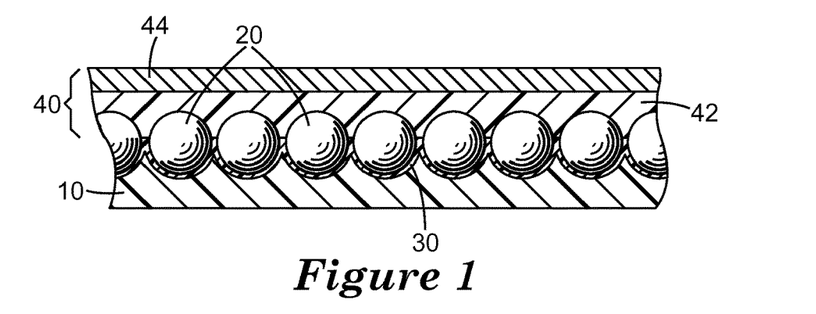
FIG. 1 shows a cross-sectional view of an embodiment of an intermediate article of this disclosure.

Examples of articles of this disclosure are provided in the Figures. FIG. 1 is a cross sectional depiction of an embodiment of an intermediate article of this disclosure. In FIG. 1, the intermediate article includes polyurethane bead bond layer 10, transparent microspheres 20, reflective layer 30 and carrier layer 40. Carrier layer 40 includes sheet layer 44 and a coating of thermoplastic polymeric carrier material 42.

Figure 2:
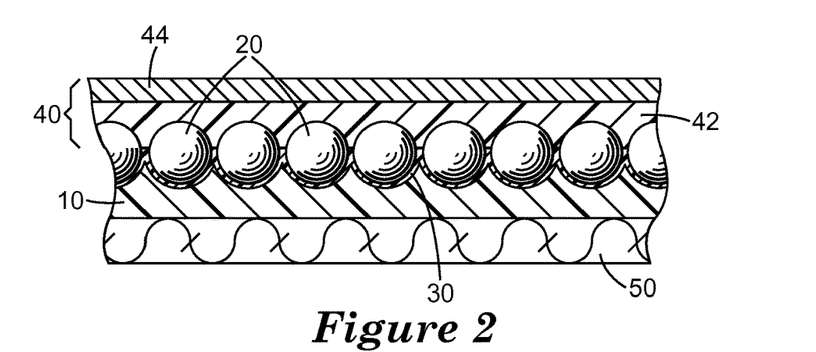
FIG. 2 shows a cross-sectional view of an embodiment of an intermediate article of this disclosure.

FIG. 2 depicts an alternative embodiment of an intermediate article of this disclosure. In FIG. 2, the intermediate article includes polyurethane bead bond layer 10, transparent microspheres 20, reflective layer 30 and carrier layer 40. Carrier layer 40 includes sheet layer 44 and a coating of thermoplastic polymeric carrier material 42. FIG. 2 also includes support layer 50.

Figure 3:
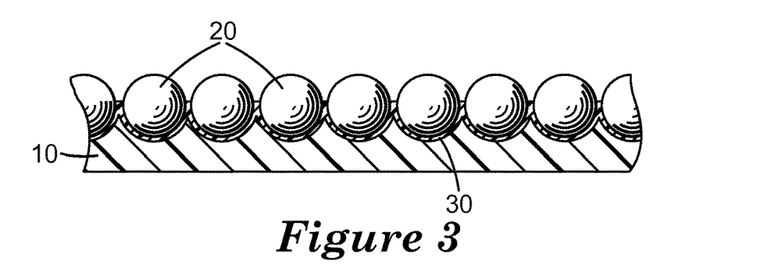
FIG. 3 shows a cross-sectional view of an embodiment of an article of this disclosure.

FIG. 3 depicts the embodiment of FIG. 1 in which the carrier layer 40 has been removed. In FIG. 3, the article includes polyurethane bead bond layer 10, transparent microspheres 20, and reflective layer 30.

Figure 4:
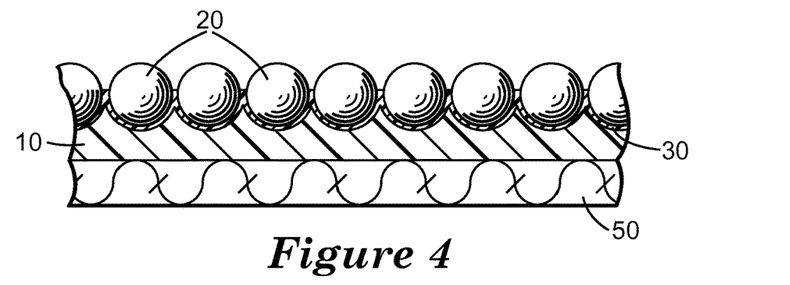
FIG. 4 shows a cross-sectional view of an embodiment of an article of this disclosure.

FIG. 4 depicts the embodiment of FIG. 2 in which the carrier layer 40 has been removed. In FIG. 4, the article includes polyurethane bead bond layer 10, transparent microspheres 20, reflective layer 30, and support layer 50.

Also disclosed herein are articles of clothing that contain retroreflective appliqués. These articles of clothing comprise a fabric with a first major surface and a second major surface, and a retroreflective appliqué attached to the first major surface of the fabric. The retroreflective appliqué is the retroreflective article described above. A wide variety of fabrics are suitable. The articles of clothing are also wash durable, as described above.

The retroreflective appliqué can be attached to the fabric surface by a wide range of attachment techniques such as mechanical attachment or adhesive attachment. Examples of mechanical attachment techniques include, for example, sewing and heat lamination. In adhesive attachment, an adhesive can be applied to the bead bond layer or a backing layer can be applied to the bead bond layer and an adhesive layer applied to the backing layer.

Examples of suitable adhesive layers include pressure sensitive adhesives, heat activated adhesives, and laminating adhesives. The adhesive layer may be applied to the bead bond layer or backing layer by coating or by lamination of a formed adhesive layer to the bead bond layer or backing layer.

A wide variety of pressure sensitive adhesives are suitable including tackified natural rubbers, synthetic rubbers, tackified styrene block copolymers, polyvinyl ethers, poly (meth) acrylates, polyurethanes, polyureas, poly-alpha-olefins, and silicones. The pressure sensitive adhesive may be covered with a release liner to protect the adhesive prior to adhesion to a substrate.

Heat activated adhesives are very similar to pressure sensitive adhesives but require the application of heat to become tacky. One advantage of heat activated adhesives is that, because they are not tacky at room temperature, they typically do not require a release liner to protect the adhesive layer prior to adhesion to a substrate.

Typically, if a laminating adhesive is used, the adhesive layer is immediately bonded to a substrate to form the adhesive substrate bond. Examples of laminating adhesives include hot melt adhesives, adhesive dispersions and suspensions, and curing adhesives such as cyanoacrylates.

A wide variety of articles of clothing are suitable for attachment of retroreflective appliqués. Examples of such articles of clothing include, for example, vests such as the safety vests frequently worn by road construction workers, but also include a wide range of other clothing types. Examples include, shirts, sweaters, jackets, coats, pants, shorts, socks, shoes, gloves, belts, hats, suits, one-piece body garments, and the like.

Figure 5:
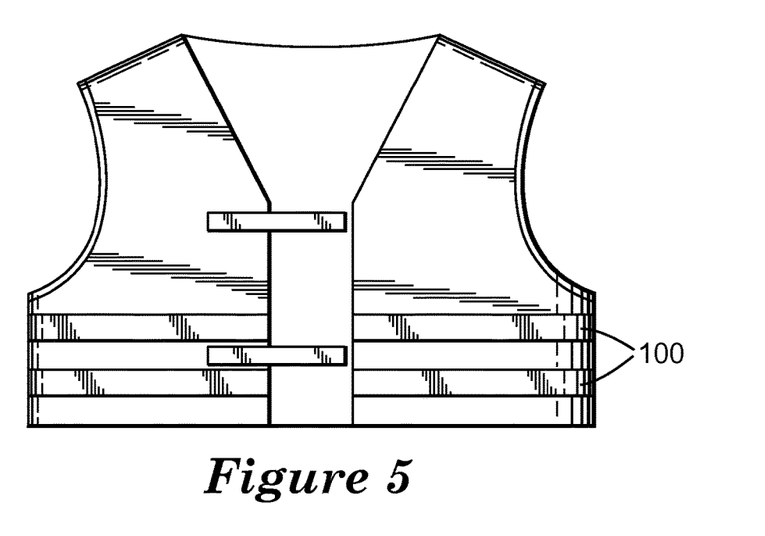
FIG. 5 shows a top view of an embodiment of an article of this disclosure.

FIG. 5 depicts an article of clothing of this disclosure. The vest in FIG. 5 includes retroreflective appliqués 100. The retroreflective appliqués 100 can be, for example an article of FIG. 1.

This disclosure includes the following embodiments:

Among the embodiments are retroreflective articles. A first embodiment includes a retroreflective article comprising: a polyurethane bead bond layer; and a layer of optical elements partially embedded in the bead bond layer, the optical elements comprising: transparent microspheres, and at least one reflective layer; wherein the polyurethane bead bond layer comprises the reaction product of a reaction mixture comprising at least one aliphatic polycarbonate polyol and at least one polyisocyanate, and wherein the reaction mixture is free of polyols containing unsaturated groups.

Embodiment 2 is the retroreflective article of embodiment 1, wherein the reaction mixture further comprises at least one additional polyol.

Embodiment 3 is the retroreflective article of embodiment 1 or 2, wherein the reaction mixture further comprises at least two additional polyols.

Embodiment 4 is the retroreflective article of embodiment 3, wherein at least one of the two additional polyols comprises a polyol with a functionality greater than 2 and wherein at least one of the two additional polyols is not a polyester polyol.

Embodiment 5 is the retroreflective article of any of embodiments 1-4, wherein the at least one polyisocyanate comprises an aliphatic polyisocyanate.

Embodiment 6 is the retroreflective article of any of embodiments 1-4, wherein the at least one polyisocyanate comprises an aromatic polyisocyanate.

Embodiment 7 is the retroreflective article of any of embodiments 1-6, wherein the amount of polyisocyanate present in the reaction mixture comprises a stoichiometric excess of polyisocyanate relative to amount of polyol.

Embodiment 8 is the retroreflective article of any of embodiments 1-7, wherein the reaction mixture further comprises at least one silane coupling agent.

Embodiment 9 is the retroreflective article of embodiment 8, wherein the silane coupling agent comprises an isocyanate-functional silane coupling agent.

Embodiment 10 is the retroreflective article of embodiment 8, wherein the silane coupling agent comprises an amino-functional silane coupling agent.

Embodiment 11 is the retroreflective article of any of embodiments 1-10, wherein the reaction mixture further comprises at least one curing catalyst.

Embodiment 12 is the retroreflective article of any of embodiments 1-11, wherein the article is wash durable.

Embodiment 13 is the retroreflective article of any of embodiments 1-12, further comprising a support layer attached to the polyurethane bead bond layer, the support layer comprising a layer of adhesive, a film layer, a fabric layer, or a non-woven layer.

Also disclosed are articles of clothing. Embodiment 14 includes an article of clothing comprising: a fabric with a first major surface and a second major surface; and a retroreflective appliqué attached to the first major surface of the fabric, the retroreflective appliqué comprising: a polyurethane bead bond layer; a layer of optical elements partially embedded in the bead bond layer, the optical elements comprising: transparent microspheres, and at least one reflective layer; wherein the polyurethane bead bond layer comprises the reaction product of at least one aliphatic polycarbonate polyol and at least one polyisocyanate, wherein the reaction mixture is free of polyols containing unsaturated groups; and a support layer attached to the polyurethane bead bond layer, the support layer comprising a layer of adhesive, a film layer, a fabric layer, or a non-woven layer, wherein the support layer is attached to the first major surface of the fabric.

Embodiment 15 is the article of clothing of embodiment 14, wherein the support layer is attached to the first major surface of the fabric by mechanical attachment or adhesive bonding.

Embodiment 16 is the article of clothing of embodiment 14 or 15, wherein the article of clothing is wash durable.

Also disclosed are methods of preparing articles. Embodiment 17 includes a method of preparing an article comprising: providing a polymeric carrier layer with a first major surface and a second major surface; providing transparent microspheres; partially embedding the transparent microspheres into the first major surface of the polymeric carrier layer such that the beads at least partially protrude from the first major surface of the polymeric carrier layer to form a layer of microspheres; depositing one or more reflective layers on at least a portion of the first major surface of the polymeric carrier layer and the layer of microspheres; providing a reaction mixture comprising at least one aliphatic polycarbonate polyol and at least one polyisocyanate, and wherein the reaction mixture is free of polyols containing unsaturated groups; applying the reaction mixture to the layer of microspheres; and curing the reaction mixture to form a polyurethane bead bond layer.

Embodiment 18 is the method of embodiment 17, wherein the reaction mixture further comprises at least one additional polyol.

Embodiment 19 is the method of embodiment 17, wherein the reaction mixture further comprises at least two additional polyols.

Embodiment 20 is the method of embodiment 19, wherein at least one of the two additional polyols comprises a polyol with a functionality greater than 2, and wherein at least one of the two additional polyols is not a polyester polyol.

Embodiment 21 is the method of any of embodiments 17-20, wherein the at least one polyisocyanate comprises an aliphatic polyisocyanate.

Embodiment 22 is the method of any of embodiments 17-20, wherein the at least one polyisocyanate comprises an aromatic polyisocyanate.

Embodiment 23 is the method of any of embodiments 17-22, wherein the amount of polyisocyanate present in the reaction mixture comprises a stoichiometric excess of polyisocyanate relative to amount of polyol.

Embodiment 24 is the method of any of embodiments 17-23, wherein the reaction mixture further comprises at least one silane coupling agent.

Embodiment 25 is the method of embodiment 24, wherein the silane coupling agent comprises an isocyanate-functional silane coupling agent.

Embodiment 26 is the method of embodiment 24, wherein the silane coupling agent comprises an amino-functional silane coupling agent.

Embodiment 27 is the method of any of embodiments 17-26, wherein the reaction mixture further comprises at least one curing catalyst.

Embodiment 28 is the method of any of embodiments 17-27, wherein curing the reaction mixture to form a polyurethane bead bond layer comprises heating the reaction mixture, allowing the reaction mixture to sit at room temperature for greater than 2 weeks, or a combination thereof.

Embodiment 29 is the method of any of embodiments 17-28, further comprising attaching a support layer to the polyurethane bead bond layer, wherein the support layer comprises a layer of adhesive, a film layer, a fabric layer, or a non-woven layer.

Embodiment 30 is the method of embodiment 29, wherein attaching the support layer to the polyurethane bead bond layer comprises contacting the support layer to the polyurethane bead bond layer prior to curing of the reaction mixture to form the polyurethane bead bond layer.

Embodiment 31 is the method of embodiment 29, wherein attaching the support layer to the polyurethane bead bond layer comprises adhesively bonding the support layer to the polyurethane bead bond layer after curing of the reaction mixture to form the polyurethane bead bond layer.

Embodiment 32 is the method of any of embodiments 17-31, further comprising removing the polymeric carrier layer to generate a retroreflective article.

Embodiment 33 is the method of embodiment 32, further comprising adhering the article to a substrate prior to removing the polymeric carrier layer.

Embodiment 34 is the method of embodiment 33, wherein the substrate comprises an article of clothing.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted. The following abbreviations are used: rpm=revolutions per minute; sec=seconds; cm=centimeters; mm=millimeters; min=minutes; g=grams; m=meters. The terms "weight %", "% by weight", and "wt %" are used interchangeably. Retroreflectivity is reported in the standard units cd/(lx·m$^2$) that is to say candelas/lux/meter$^2$.

Table of Abbreviations

| Abbreviation or Trade Designation | Description |
|---|---|
| Silane-1 | Isocayanate-functional silane coupling agent, isocyanatopropyltriethoxy silane, commercially available as SILQUEST A-LINK 25 from Momentive Performance Materials, Strongsville, OH. |
| ISO-1 | Liquid diisocyanate, diphenylmethane diisocyanate, commercially available as MONDUR MLQ from Bayer MaterialScience, Pittsburgh, PA. |
| PC Diol-1 | Polycarbonate diol with Mn of approximately 2,000 g/mol, commercially available as KURARAY POLYOL C-2050, from Kuraray America, Inc. |
| PC Diol-2 | Polycarbonate diol with Mn of approximately 2,000 g/mol, commercially available as KURARAY POLYOL C-2090 from Kuraray America, Inc. |
| PC Diol-3 | Polycarbonate diol with Mn of approximately 3,000 g/mol, commercially available as KURARAY POLYOL C-3090 from Kuraray America, Inc. |
| PC Diol-4 | Polycarbonate diol with Mn of approximately 500 g/mol, commercially available as KURARAY POLYOL C-590 from Kuraray America, Inc. |
| PE Diol | Polyester diol, polycaprolactone diol with a Mn of approximately 2,000 commercially available as CAPA 7201A from Perstorp Group, Sweden. |
| BPA Diol | Polyethoxylated Bis-phenol A diol commercially available as SYNFAC 8009 from Milliken Chemcials, Spartanburg, SC. |
| Triol-1 | Polyethoxylated trimethylol propane triol commercially available as Polyol 3611 from Perstorp Group, Sweden. |
| Triol-2 | Methylpentane diol-adipic acid modified trimethylol propane triol with Mn of approximately 500 g/mol, commercially available as KURARAY POLYOL F-510 from Kuraray America, Inc. |
| Cure Catalyst-1 | Polyurethane cure catalyst, dibutyltin dilaurate (25% solids in Methyl ethyl ketone) commercially available as FASCAT 4202 from Arkema, Inc. King of Prussia, PA. |
| Cure Catalyst-2 | Polyurethane cure catalyst, zirconium chelate complex, commercially available as K-KAT 6212 from King Industries, Norwalk, CT. |

Synthesis Example S1: Vapor Coated Glass Bead Layer

A temporary glass bead carrier was prepared in a procedure as described in U.S. Pat. No. 5,474,827. A polyethylene layer was coated on a paper backing. The polyethylene layer was heated, and glass beads with diameter in the range of 40-90 micrometers were cascaded and sunk into the polyethylene. The sink depth was smaller than the glass beads diameter, and a portion of the microspheres remained exposed above the surface of the polyethylene. The coated glass bead layers were vapor coated with a thin layer of aluminum metal to form an aluminum metal mirror layer.

Examples 1-4 and Comparative Example C1

Bead bond coatings were applied to samples of the vapor coated glass bead layer material described in Synthesis Example S1. For Examples 1-4 a polycarbonate-based bead bond was used, for Comparative Example C1 a polycaprolactone-based bead bond was used.
Preparation of Bead Bond Reactive Mixtures:
The components shown in Table 1 were added in the order listed to a Max 60 SpeedMixer cup, the lid was attached, and the mixture was centrifugally mixed at 1600 rpm for 20 sec using a FlackTec Inc SpeedMixer DAC 150 FVZ. The resulting mixture was coated on a 12×24 inch (30.5×61.0 cm) sheet of the vapor coated glass bead layer material using a notch bar coater to a wet thickness of 0.15 mm (6 mils). The coated sheet was heated in a 150° F. (66° C.) oven for 4 min. The coated sheet was removed from the oven and a 14×26 inch (35.6×66.0 cm) piece of polyester fabric was laminated onto the coating with a hand held roller. This laminate was then heated in a 215° F. (102° C.) oven for 15 min. The laminate was removed from the oven and allowed to stand at room temperature for 2 weeks, at which time the carrier was stripped away, exposing the previously embedded surfaces of the monolayer of glass microspheres to produce a retroreflective fabric article.

TABLE 1

| Reagent | Example 1 | Example 2 | Example 3 | Example 4 | Comparative Example C1 |
|---|---|---|---|---|---|
| Silane-1 (g) | 1.09 | 1.09 | 0.79 | 1.04 | 1.05 |
| ISO-1 (g) | 5.34 | 5.34 | 4.03 | 5.11 | 5.34 |
| PC Diol-1 (g) | 19.69 | 0 | 0 | 0 | 0 |
| PC Diol-2 (g) | 0 | 19.69 | 0 | 18.89 | 0 |
| PC Diol-3 (g) | 0 | 0 | 22.23 | 0 | 0 |
| PC Diol-4 (g) | 0 | 0 | 0 | 2.87 | 0 |
| PE Diol (g) | 0 | 0 | 0 | 0 | 19.69 |
| BPA Diol (g) | 2.99 | 2.99 | 2.25 | 0 | 2.99 |
| Triol-1 (g) | 0.93 | 0.93 | 0.70 | 0 | 0.93 |
| Triol-2 (g) | 0 | 0 | 0 | 1.63 | 0 |
| Cure Catalyst-1 (g) | 0.036 | 0.036 | 0.036 | 0 | 0.072 |
| Cure Catalyst-2 (g) | 0 | 0 | 0 | 0.47 | 0 |

Wash Durability Tests:

Test samples of the fabric articles of Examples 1-4 and Comparative Example C1 were prepared by sewing appliqués of the fabric articles of 2×10 inch (5.1×25.4 cm) onto a 30×25 inch (76.2×63.5 cm) piece of polyester/cotton 85/15 fluorescent orange fabric having a weight of 270 g/m². A second piece of identical fabric was attached opposite to the side with the test samples by sewing seams around the edges to form a double layer construction with the test appliqués facing outwards. The test samples of Examples 1-4 and Comparative Example C1 were aged for 3 weeks or 8 months at 21° C. (70° F.) and 50% RH and then were washed according to Method 8 of the method ISO 15797 ("Textiles—Industrial washing and finishing procedures for testing of workwear") using a UniMac UF50 washer-extractor. The samples were dried according to the test method using a Leonard Automatics, Inc. IM-48 tunnel finisher. The results are shown in Tables 2 and 3. Examples 1-4 show higher retroreflectivity retention after washing even after aging for 8 months.

TABLE 2

Wash Data After 3 Week Aging

| Example | Initial Retroreflectivity (cd/lx · m²) | Retroreflectivity After 50 Wash Cycles (cd/lx · m²) | Percent Retention (%) |
|---|---|---|---|
| 1 | 449 | 343 | 76 |
| 2 | 406 | 327 | 80 |
| 3 | 382 | 312 | 82 |
| 4 | 463 | 295 | 64 |
| C1 | 441 | 332 | 75 |

TABLE 3

Wash Data After 8 Month Aging

| Example | Initial Retroreflectivity (cd/lx · m²) | Retroreflectivity After 50 Wash Cycles (cd/lx · m²) | Percent Retention (%) |
|---|---|---|---|
| 1 | 447 | 312 | 70 |
| 2 | 460 | 346 | 75 |
| 3 | 398 | 318 | 80 |
| 4 | 389 | 249 | 64 |
| C1 | 428 | 73 | 17 |

What is claimed is:

1. A retroreflective article comprising:
a polyurethane bead bond layer; and
a layer of optical elements partially embedded in the bead bond layer, the optical elements comprising:
  transparent microspheres, and at least one reflective layer;
wherein the polyurethane bead bond layer comprises the reaction product of a reaction mixture comprising at least one aliphatic polycarbonate polyol and at least one polyisocyanate, and wherein the reaction mixture is free of polyols containing unsaturated groups, wherein the at least one aliphatic polycarbonate polyol is described by Formula 1:

HO—[(CH$_2$)$_2$CHR$^1$(CH$_2$)$_n$—O—(CO)—O—]$_m$—[(CH$_2$)$_2$CHR$^1$(CH$_2$)$_n$]—OH      Formula 1 wherein (CO) defines a carbonyl group C=O;
R$^1$ is hydrogen or methyl;
n is an integer of 2 or 3, such that n is 3 when R$^1$ is hydrogen, and n is 2 when R$^1$ is methyl; and
m is number in the range 3-23.

2. The retroreflective article of claim 1, wherein the reaction mixture further comprises at least one additional polyol.

3. The retroreflective article of claim 1, wherein the reaction mixture further comprises at least two additional polyols.

4. The retroreflective article of claim 3, wherein at least one of the two additional polyols comprises a polyol with a functionality greater than 2, and wherein at least one of the two additional polyols is not a polyester polyol.

5. The retroreflective article of claim 1, wherein the at least one polyisocyanate comprises an aliphatic polyisocyanate.

6. The retroreflective article of claim 1, wherein the at least one polyisocyanate comprises an aromatic polyisocyanate.

7. The retroreflective article of claim 1, wherein the amount of polyisocyanate present in the reaction mixture comprises a stoichiometric excess of polyisocyanate relative to amount of polyol.

8. The retroreflective article of claim 1, wherein the reaction mixture further comprises at least one silane coupling agent.

9. The retroreflective article of claim 1, wherein the reaction mixture further comprises at least one curing catalyst.

10. The retroreflective article of claim 1, wherein the article is wash durable.

11. The retroreflective article of claim 1, further comprising a support layer attached to the polyurethane bead bond layer, the support layer comprising a layer of adhesive, a film layer, a fabric layer, or a non-woven layer.

12. An article of clothing comprising:
a fabric with a first major surface and a second major surface; and
a retroreflective appliqué attached to the first major surface of the fabric, the retroreflective appliqué comprising:
a polyurethane bead bond layer;
a layer of optical elements partially embedded in the bead bond layer, the optical elements comprising: transparent microspheres, and at least one reflective layer;
wherein the polyurethane bead bond layer comprises the reaction product of at least one aliphatic polycarbonate polyol and at least one polyisocyanate, wherein the reaction mixture is free of polyols containing unsaturated groups, wherein the at least one aliphatic polycarbonate polyol is described by Formula 1:

Formula 1 wherein (CO) defines a carbonyl group C=O;
$R^1$ is hydrogen or methyl;
n is an integer of 2 or 3, such that n is 3 when $R^1$ is hydrogen, and n is 2 when $R^1$ is methyl; and
m is number in the range 3-23; and
a support layer attached to the polyurethane bead bond layer, the support layer comprising a layer of adhesive, a film layer, a fabric layer, or a non-woven layer, wherein the support layer is attached to the first major surface of the fabric.

13. A method of preparing an article comprising:
providing a polymeric carrier layer with a first major surface and a second major surface;
providing transparent microspheres;
partially embedding the transparent microspheres into the first major surface of the polymeric carrier layer such that the beads at least partially protrude from the first major surface of the polymeric carrier layer to form a layer of microspheres;
depositing one or more reflective layers on at least a portion of the first major surface of the polymeric carrier layer and the layer of microspheres;
providing a reaction mixture comprising at least one aliphatic polycarbonate polyol and at least one polyisocyanate, and wherein the reaction mixture is free of polyols containing unsaturated groups, wherein the at least one aliphatic polycarbonate polyol is described by Formula 1:

Formula 1 wherein (CO) defines a carbonyl group C=O;
$R^1$ is hydrogen or methyl;
n is an integer of 2 or 3, such that n is 3 when $R^1$ is hydrogen, and n is 2 when $R^1$ is methyl; and
m is number in the range 3-23;
applying the reaction mixture to the layer of microspheres; and
curing the reaction mixture to form a polyurethane bead bond layer.

14. The method of claim 13, wherein the amount of polyisocyanate present in the reaction mixture comprises a stoichiometric excess of polyisocyanate relative to amount of polyol.

15. The method of claim 13, wherein the reaction mixture further comprises at least one silane coupling agent.

16. The method of claim 13, wherein the reaction mixture further comprises at least one curing catalyst.

17. The method of claim 13, further comprising attaching a support layer to the polyurethane bead bond layer, wherein the support layer comprises a layer of adhesive, a film layer, a fabric layer, or a non-woven layer.

18. The method of claim 17, wherein attaching the support layer to the polyurethane bead bond layer comprises contacting the support layer to the polyurethane bead bond layer prior to curing of the reaction mixture to form the polyurethane bead bond layer.

19. The method of claim 17, wherein attaching the support layer to the polyurethane bead bond layer comprises adhesively bonding the support layer to the polyurethane bead bond layer after curing of the reaction mixture to form the polyurethane bead bond layer.

20. The method of claim 13, further comprising removing the polymeric carrier layer to generate a retroreflective article.

21. The method of claim 20, further comprising adhering the article to a substrate prior to removing the polymeric carrier layer.

* * * * *